(12) United States Patent  
Lan et al.

(10) Patent No.: US 9,133,565 B2  
(45) Date of Patent: Sep. 15, 2015

(54) CRYSTALLINE SILICON INGOT AND METHOD OF FABRICATING THE SAME

(75) Inventors: Wen-Chieh Lan, Hsinchu (TW); Yong-Cheng Yu, Hsinchu (TW); Wen-Huai Yu, Hsinchu (TW); Sung-Lin Hsu, Hsinchu (TW); Wen-Ching Hsu, Hsinchu (TW)

(73) Assignee: Sino-American Silicon Products Inc., Hsinchu (TW)

(*) Notice: Subject to any disclaimer, the term of this patent is extended or adjusted under 35 U.S.C. 154(b) by 800 days.

(21) Appl. No.: 13/430,131

(22) Filed: Mar. 26, 2012

(65) Prior Publication Data

US 2013/0095028 A1 Apr. 18, 2013

(30) Foreign Application Priority Data

Oct. 14, 2011 (TW) .............................. 100137424 A (51) Int. Cl.
 C30B 11/02 (2006.01)
 C30B 11/14 (2006.01)
 C30B 29/06 (2006.01)
 C30B 11/00 (2006.01)

(52) U.S. Cl.
 CPC ................. *C30B 11/02* (2013.01); *C30B 11/00* (2013.01); *C30B 11/14* (2013.01); *C30B 29/06* (2013.01)

(58) Field of Classification Search
 CPC .... C30B 11/00; C30B 11/002; C30B 11/003; C30B 11/006; C30B 11/02; C30B 11/04; C30B 11/14; C30B 28/06; C30B 29/06; C01B 33/02
 USPC .......... 423/348; 117/54, 73, 81, 83, 902, 911, 117/928, 931; 428/321.1; 264/332
 See application file for complete search history.

(56) References Cited

U.S. PATENT DOCUMENTS

| 2007/0169684 | A1* | 7/2007 | Stoddard ...................... 117/13 |
| 2010/0193664 | A1* | 8/2010 | Stoddard ................... 249/114.1 |
| 2011/0297223 | A1* | 12/2011 | Krause et al. ................. 136/256 |

* cited by examiner

*Primary Examiner* — Colleen Dunn  
(74) *Attorney, Agent, or Firm* — Osha Liang LLP (57) ABSTRACT

A crystalline silicon ingot and a method of manufacturing the same are provided. Using a crystalline silicon seed layer, the crystalline silicon ingot is formed by a directional solidification process. The crystalline silicon seed layer is formed of multiple primary monocrystalline silicon seeds and multiple secondary monocrystalline silicon seeds. Each of the primary monocrystalline silicon seeds has a first crystal orientation different from (100). Each of the secondary monocrystalline silicon seeds has a second crystal orientation different from the first crystal orientation. Each of the primary monocrystalline silicon seeds is adjacent to at least one of the secondary monocrystalline silicon seeds, and separate from the others of the primary monocrystalline silicon seeds.

9 Claims, 7 Drawing Sheets

CRYSTALLINE SILICON INGOT AND METHOD OF FABRICATING THE SAME

CROSS-REFERENCE TO RELATED APPLICATION

This utility application claims priority to Taiwan application serial number 100137424, filed Oct. 14, 2011, which is incorporated herein by reference.

BACKGROUND OF THE DISCLOSURE

1. Field of the Disclosure

The invention relates to a crystalline silicon ingot and a method of fabricating the same, and more particularly, to a crystalline silicon ingot formed using a crystalline silicon seed layer based on a directional solidification process and a method of fabricating the same.

2. Brief Description of the Related Art

Most solar cells absorb sun and then create photovoltaic effects. Currently, the solar cells contain a main material of silicon because silicon is the second most obtainable element in the world and has advantages of cost effectiveness, freedom from poison and high stability. Besides, silicon is commonly used in a semiconductor industry.

Solar cells mainly made of silicon can be divided into three types of monocrystalline silicon, polycrystalline silicon and amorphous silicon. In consideration of cost, polycrystalline silicon is used as a material of solar cells because the cost of polycrystalline silicon is lower than that of monocrystalline silicon produced by a traditional Czochralski method and floating zone method.

Polycrystalline silicon used for fabricating solar cells is generally formed by a casting process. It is a common technology that polycrystalline silicon created by a casting process can be applied to solar cells. In brief, a crystalline silicon ingot of polycrystalline silicon can be formed by melting high-purity silicon in a mode, such as quartz crucible, and cooling it in a control of condensation. Next, the crystalline silicon ingot of polycrystalline silicon is sawed into wafers approaching a size of a solar cell and the wafers can be applied to solar cells. The crystalline silicon ingot of polycrystalline silicon produced by the above method is an aggregate of silicon crystal grains. The wafers made by the above method have random crystal orientation between crystal grains.

With regards to traditional polycrystalline silicon, the random crystal orientation makes it difficult to rough surface of a chip. Roughed surface can reduce light reflection and enhance absorption of light passing through surface of a cell, and thus an efficiency of a photovoltaic cell can be enhanced. Besides, a kink grain boundary between polysilicon crystal grains tends to cause clusters of nucleus dislocations or structural defects of line dislocations. These dislocations and impurities attracted by them cause fast recombination of charge carriers in a photovoltaic cell made by traditional polycrystalline silicon and reduced cell efficiencies. A photovoltaic cell made of this kind of polycrystalline silicon has lower efficiencies than that made of monocrystalline silicon even in consideration of defects in the monocrystalline silicon produced by a traditional technology. However, traditional polycrystalline silicon can be produced in a relatively simple way, in a relatively low cost and in effective defect passivation, and thus polycrystalline silicon is widely used in fabrication of a photovoltaic cell.

U.S. Publication No. 2010193031 discloses a prior art using crystalline silicon seeds and a directional solidification process. Referring to U.S. Publication No. 2010193031, monocrystalline silicon having a crystal orientation of (100) is used as primary crystalline seeds and a silicon wafer used for fabricating monocrystalline silicon solar cells is expected to have a crystal orientation of (100), with a light-trapping surface formed using an etching process. Unfortunately, in the period of competition between crystal grains having the crystal orientation of (100) and those of random successive nucleation, crystal grains having the crystal orientation of (100) is worse performed. In order to maximize an amount of crystalline seeds in an ingot, the reference discloses that a boundary of silicon having a crystal orientation of (111) encloses an area of crystalline silicon seeds having a crystal orientation of (100), and the boundary restrains crystals in other crystal orientations. Thereby, an ingot of monocrystalline silicon and/or bi-crystal silicon with high performance can be casted, and a few obtained carriers of a wafer employed for fabricating solar cells with high effects have maximized life spans. The term of monocrystalline silicon means the whole body of monocrystalline silicon having an identical crystal orientation. The term of bi-crystal silicon means a silicon body containing more than or equal to 50% volume thereof having an identical crystal orientation and the rest thereof having another identical crystal orientation. For example, the bi-crystal silicon may contain a body of monocrystalline silicon having an identical crystal orientation neighboring the rest body of monocrystalline silicon having another identical crystal orientation. Besides, traditional polycrystalline silicon means crystallized silicon densely spreading in a centimetric scale and containing crystals in random crystal orientations.

However, a crystalline silicon ingot formed using primary monocrystalline silicon seeds having a crystal orientation of (100) can be sliced into silicon wafers for forming solar cells having possibility to enhance photo-electron conversion efficiencies. In other words, the monocrystalline silicon seeds having the crystal orientation of (100) are not the best choice for the primary monocrystalline silicon seeds.

Besides, when a crystalline silicon ingot is formed, in order to reduce probabilities of harmful defects created at boundaries of two neighboring monocrystalline silicon seeds in a crystalline silicon seed layer, U.S. Publication No. 20100193664 discloses a method of eliminating gaps between boundaries of two neighboring monocrystalline silicon seeds in a crystalline silicon seed layer, but the method dramatically increases a cost of fabricating a crystalline silicon ingot.

SUMMARY OF THE DISCLOSURE

The present invention is directed to a crystalline silicon ingot and a method of fabricating the same. The crystalline silicon ingot is being formed with limited harmful defects created at boundaries of two neighboring monocrystalline silicon seeds even though the boundaries of the two neighboring monocrystalline silicon seeds are not joined.

Typically, the present invention is directed to a crystalline silicon ingot formed with a high quality using a directional solidification process.

In one embodiment for fabricating a crystalline silicon ingot, a crystalline silicon seed layer is first provided in a mold, wherein the crystalline silicon seed layer is formed of multiple primary monocrystalline silicon seeds and multiple secondary monocrystalline silicon seeds. Each of the primary monocrystalline silicon seeds has a first crystal orientation different from (100) and each of the secondary monocrystalline silicon seeds has a second crystal orientation different from the first crystal orientation. An angle between the first and second crystal orientations is not less than about 35 degrees. Each of the primary monocrystalline silicon seeds is adjacent to at least one of the secondary monocrystalline silicon seeds, and separate from the others of the primary monocrystalline silicon seeds. Next, a silicon melt is filled in the mold such that the silicon melt contacts the crystalline silicon seed layer. Finally, the mold is cooled using a directional solidification process such that the silicon melt can be solidified and the crystalline silicon ingot containing the crystalline silicon seed layer can be formed.

In one embodiment, a crystalline silicon ingot contains a crystalline silicon seed layer at a bottom thereof. The crystalline silicon seed layer is formed of multiple primary monocrystalline silicon seeds and multiple secondary monocrystalline silicon seeds. Each of the primary monocrystalline silicon seeds has a first crystal orientation different from (100) and each of the secondary monocrystalline silicon seeds has a second crystal orientation different from the first crystal orientation. An angle between the first and second crystal orientations is not less than about 35 degrees. Each of the primary monocrystalline silicon seeds is adjacent to at least one of the secondary monocrystalline silicon seeds, and separate from the others of the primary monocrystalline silicon seeds.

In one embodiment, the first crystal orientation is (110), (232), (112) or other crystal orientations, in which an angle between each and (100) is not less than 35 degrees.

In one embodiment, the second crystal orientation is (100).

In one embodiment, the primary monocrystalline silicon seeds and the secondary monocrystalline silicon seeds are alternately arranged in the mold.

In one embodiment, the secondary monocrystalline silicon seeds are alternately arranged between the primary monocrystalline silicon seeds. A ratio of a volume of the primary monocrystalline silicon seeds to a volume of the crystalline silicon seed layer is greater than about 80%.

In one embodiment, the secondary monocrystalline silicon seeds are alternately arranged between the primary monocrystalline silicon seeds. One of the secondary monocrystalline silicon seeds alternately arranged between two of the primary monocrystalline silicon seeds has a width between 3 and 5 centimeters.

The accompanying drawings are included to provide a further understanding of the invention, and are incorporated as a part of this specification. The drawings illustrate embodiments of the invention and, together with the description, serve to explain the principles of the invention.

BRIEF DESCRIPTION OF THE DRAWINGS

The drawings disclose illustrative embodiments of the present disclosure. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same numeral appears in different drawings, it refers to the same or like components or steps.

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure.

While certain embodiments are depicted in the drawings, one skilled in the art will appreciate that the embodiments depicted are illustrative and that variations of those shown, as well as other embodiments described herein, may be envisioned and practiced within the scope of the present disclosure.

DETAILED DESCRIPTION OF THE INVENTION

Illustrative embodiments are now described. Other embodiments may be used in addition or instead. Details that may be apparent or unnecessary may be omitted to save space or for a more effective presentation. Conversely, some embodiments may be practiced without all of the details that are disclosed.

FIGS. 1A-1D are schematic views of fabricating a crystalline silicon ingot in accordance with an embodiment of the present invention.

Figure 1A:
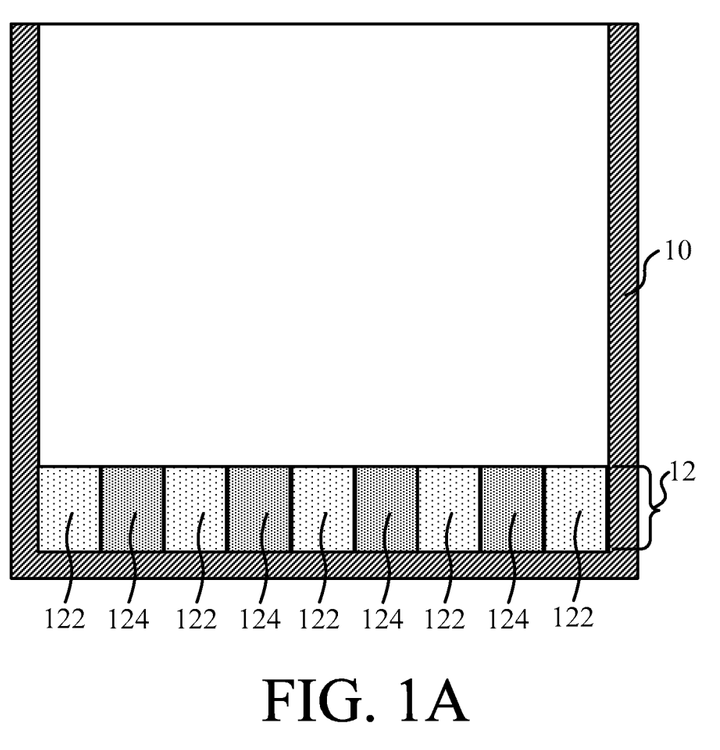
FIGS. 1A-1D are schematic views of fabricating a crystalline silicon ingot in accordance with an embodiment of the present invention.

Referring to FIG. 1A, in accordance with an embodiment, a mold 10 is first provided and is adapted to be used to have a silicon raw material cooled or melted by a directional solidification process. In an embodiment, the mold 10 is a quartz crucible.

Next, referring to FIG. 1A, a crystalline silicon seed layer 12 is provided in the mold 10, wherein the crystalline silicon seed layer 12 is formed of multiple primary monocrystalline silicon seeds 122 and multiple secondary monocrystalline silicon seeds 124.

Each of the primary monocrystalline silicon seeds 122 has a first crystal orientation vertical to a top surface of the primary monocrystalline silicon seeds 122, wherein the first crystal orientation is different from (100). Each of the secondary monocrystalline silicon seeds 124 has a second crystal orientation vertical to a top surface of the secondary monocrystalline silicon seeds 124, wherein the second crystal orientation is different from the first crystal orientation. An angle θ1 between the first and second crystal orientations is not less than about 35 degrees, wherein the angle θ1 is between a steering vector of the first crystal orientation and a steering vector of the second crystal orientation and can be calculated using the law of cosine. Each of the primary monocrystalline silicon seeds 122 is adjacent to at least one of the secondary monocrystalline silicon seeds 124, and separate from the others of the primary monocrystalline silicon seeds 122.

Figure 1B:
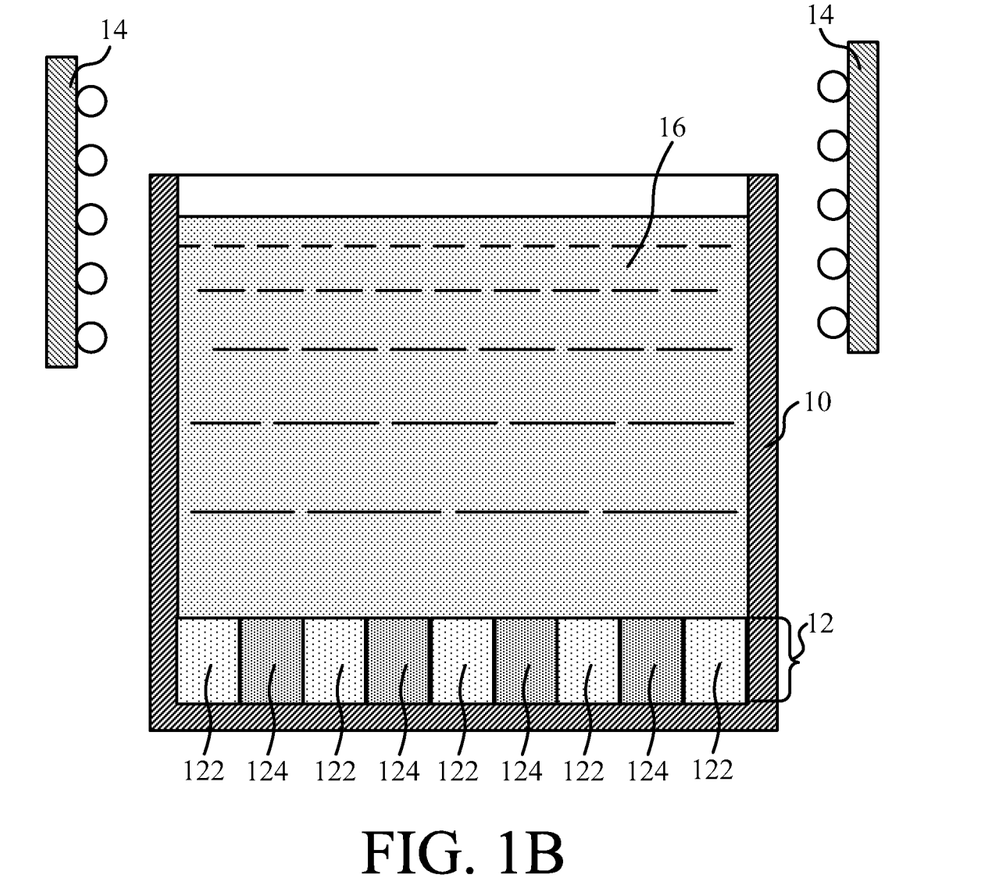

Next, referring to FIG. 1B, the mold 10 containing the crystalline silicon seed layer 12 is placed in a directional solidification crystal growth furnace. FIG. 1B shows a heater 14 of the crystal growth furnace.

Next, referring to FIG. 1B, a silicon melt 16 is filled in the mold 10 such that the silicon melt 16 contacts the crystalline silicon seed layer 12.

Figure 1C:
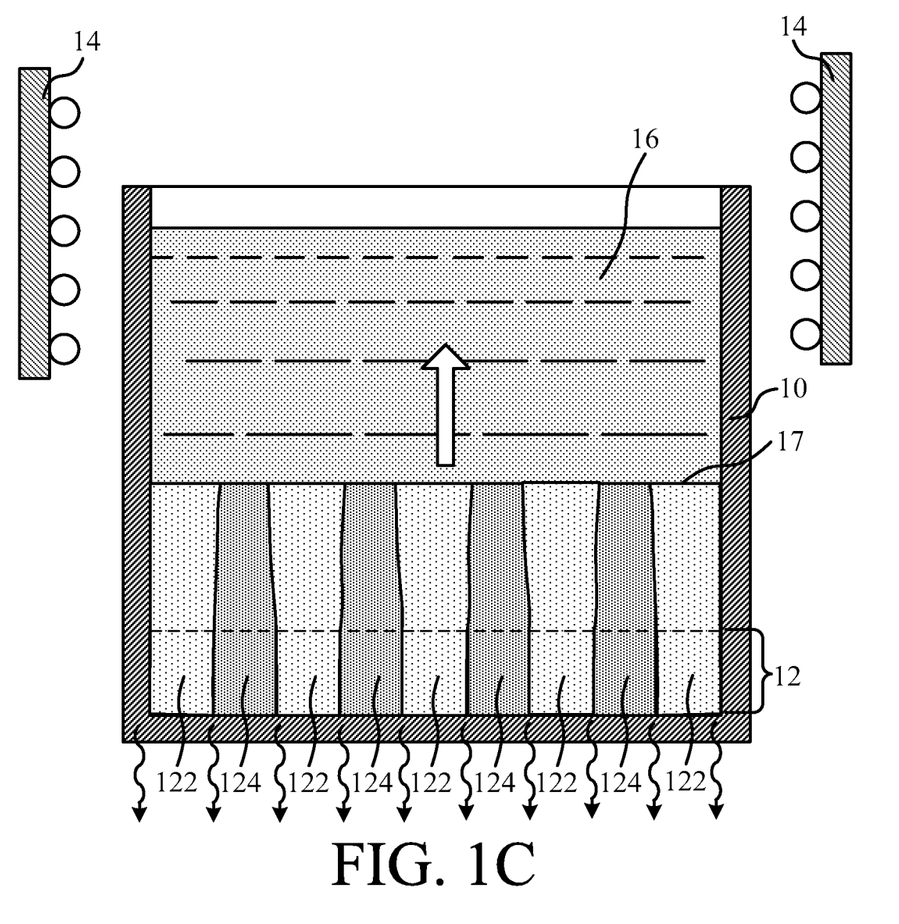

Next, referring to FIG. 1C, using a directional solidification process to cool the mold 10, the silicon melt 16 is seeded from the crystalline silicon seed layer 12 and solidified toward an opening in the mold 10. In the process of solidifying the silicon melt 16, the interface 17 between solid and liquid phases and at frontiers of the silicon melt 16 and solidified monocrystalline silicon seeds 122 and 124 moves toward the opening in the mold 10.

Figure 1D:
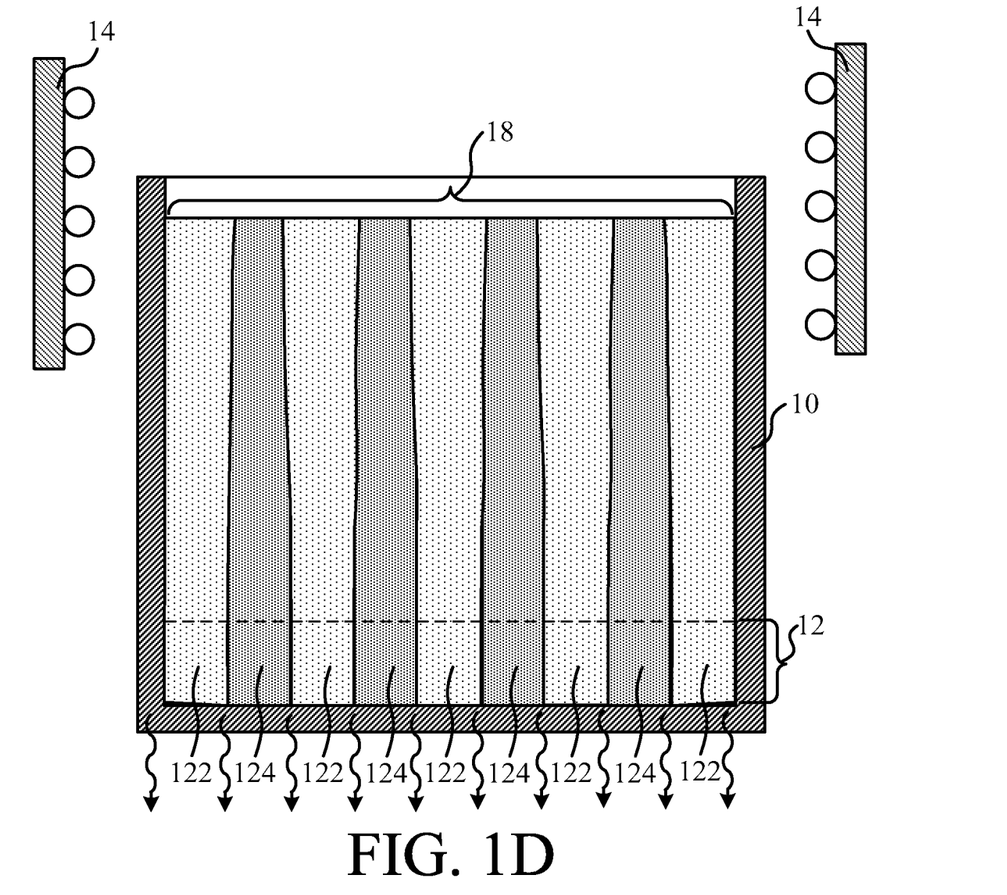

Finally, referring to FIG. 1D, the mold 10 continues to be cooled using the directional solidification process such that a crystalline silicon ingot 18 can be formed. Based on the arrangement of the monocrystalline silicon seeds 122 and 124 of the crystalline silicon seed layer 12, the crystalline silicon ingot 18 can be casted like an ingot of mono-like crystal or bi-crystal silicon having high performance. In the present application, the term of "mono-like crystal silicon" means a crystalline silicon body having more than 75% volume with an identical crystal orientation. For example, this kind of monocrystalline silicon can contain a monocrystalline silicon body neighboring polysilicon regions, or can contain a large and continuous crystalline silicon body, a part or all of which contains relatively small crystalline silicon bodies having other crystal orientations. The term of "bi-crystal silicon" is described as above.

The crystalline silicon seed layer 12 can be cut from a bottom of another crystalline silicon ingot formed in accordance with the method of the present invention.

In an embodiment, the first crystal orientation is (110), (232), (112) or other crystal orientations, in which an angle between each and (100) is not less than about 35 degrees.

In an embodiment, the second crystal orientation is (100).

Figure 2:
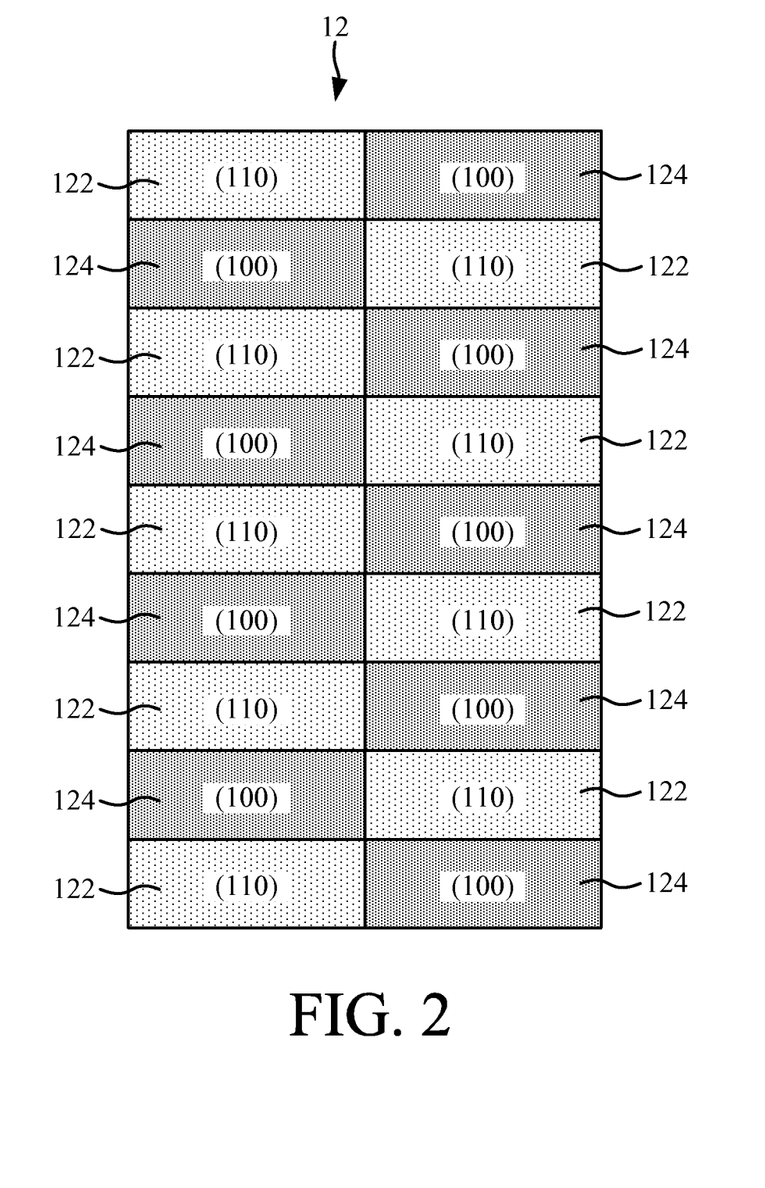
FIG. 2 is a top view of a crystalline silicon seed layer in accordance with an embodiment.

In an embodiment, the primary monocrystalline silicon seeds 122 and the secondary monocrystalline silicon seeds 124 are alternately arranged in the mold 10. For example, FIG. 2 is a top view of a crystalline silicon seed layer in accordance with an embodiment. Referring to FIG. 2, the crystalline silicon seed layer 12 is formed of multiple primary monocrystalline silicon seeds 122 having a crystal orientation of (110) and multiple secondary monocrystalline silicon seeds 124 having a crystal orientation of (100), and the primary monocrystalline silicon seeds 122 having the crystal orientation of (110) and the secondary monocrystalline silicon seeds 124 having the crystal orientation of (100) are alternately arranged. Each of the primary monocrystalline silicon seeds 122 having the crystal orientation of (110) is adjacent to at least one of the secondary monocrystalline silicon seeds 124 having the crystal orientation of (100), and separate from the others of the primary monocrystalline silicon seeds 122 having the crystal orientation of (110). Thereby, using the crystalline silicon seed layer 12, an ingot of bi-crystal silicon having high performance can be casted by the directional solidification process. The crystalline silicon ingot is being formed with limited harmful defects created at boundaries of the primary monocrystalline silicon seeds 122 having the crystal orientation of (110) and the neighboring secondary monocrystalline silicon seeds 124 having the crystal orientation of (100) even though the boundaries of the two neighboring monocrystalline silicon seeds 122 and 124 are not joined.

Figure 3:
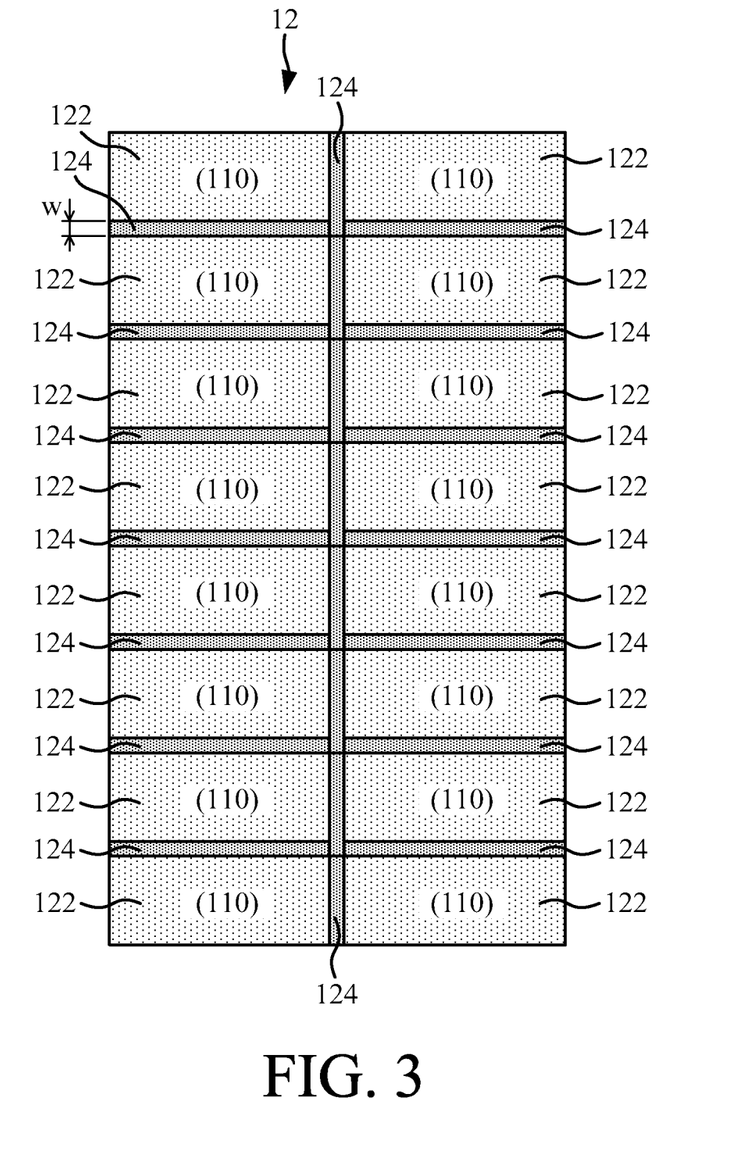
FIG. 3 is a top view of a crystalline silicon seed layer in accordance with another embodiment.

In another embodiment, the secondary monocrystalline silicon seeds 124 are alternately arranged between the primary monocrystalline silicon seeds 122. A ratio of a volume of the primary monocrystalline silicon seeds 122 to a volume of the crystalline silicon seed layer 12 is greater than about 80%. For example, FIG. 3 is a top view of a crystalline silicon seed layer in accordance with another embodiment. Referring to FIG. 3, the crystalline silicon seed layer 12 is formed of multiple primary monocrystalline silicon seeds 122 having a crystal orientation of (110) and multiple secondary monocrystalline silicon seeds 124 having a crystal orientation of (100), and the primary monocrystalline silicon seeds 122 having the crystal orientation of (110) and the secondary monocrystalline silicon seeds 124 having the crystal orientation of (100) are alternately arranged. Each of the primary monocrystalline silicon seeds 122 having the crystal orientation of (110) is adjacent to at least one of the secondary monocrystalline silicon seeds 124 having the crystal orientation of (100), and separate from the others of the primary monocrystalline silicon seeds 122 having the crystal orientation of (110). Thereby, using the crystalline silicon seed layer 12, an ingot of mono-like crystal silicon having high performance can be casted by the directional solidification process. The crystalline silicon ingot is being formed with limited harmful defects created at boundaries of the primary monocrystalline silicon seeds 122 having the crystal orientation of (110) and the neighboring secondary monocrystalline silicon seeds 124 having the crystal orientation of (100) even though the boundaries of the two neighboring monocrystalline silicon seeds 122 and 124 are not joined.

In an embodiment, referring to FIG. 3, the secondary monocrystalline silicon seeds 124 are alternately arranged between the primary monocrystalline silicon seeds 122. One of the secondary monocrystalline silicon seeds 124 alternately arranged between two of the primary monocrystalline silicon seeds 122 has a width w between 3 and 5 centimeters.

In an embodiment of the present invention, the crystalline silicon seed layer 12 is formed of multiple primary monocrystalline silicon seeds and multiple secondary monocrystalline silicon seeds. The difference from the crystalline silicon seed layers 12 in FIGS. 2 and 3 is that each of the primary monocrystalline silicon seeds has a first crystal orientation vertical to a top surface thereof and a second crystal orientation vertical to a side surface thereof, wherein the first crystal orientation is different from (100). Each of the secondary monocrystalline silicon seeds has the first crystal orientation vertical to a top surface thereof and a third crystal orientation vertical to a side surface thereof, wherein the third crystal orientation is different from the second crystal orientation. An angle θ2 between the third and second crystal orientations is not less than about 35 degrees. Each of the primary monocrystalline silicon seeds is adjacent to at least one of the secondary monocrystalline silicon seeds, and separate from the others of the primary monocrystalline silicon seeds. Thereby, each of the primary monocrystalline silicon seeds has side surfaces with a different crystal orientation from that of side surfaces of the neighboring secondary monocrystalline silicon seeds. In an embodiment, the first crystal orientation is (110), (232), (112) or other crystal orientations, in which an angle between each and (100) is not less than about 35 degrees. In an embodiment, the primary monocrystalline silicon seeds and the secondary monocrystalline silicon seeds are alternately arranged in the mold 10. In an embodiment, the primary monocrystalline silicon seeds and the secondary monocrystalline silicon seeds are alternately arranged in the mold 10.

Referring to FIG. 1D, the crystalline silicon ingot 18 contains a crystalline silicon seed layer 12 at a bottom thereof. The crystalline silicon seed layer 12 is formed of multiple primary monocrystalline silicon seeds 122 and multiple secondary monocrystalline silicon seeds 124. The difference from the prior art is that each of the primary monocrystalline silicon seeds 122 has a first crystal orientation vertical to a top surface of the primary monocrystalline silicon seeds 122, wherein the first crystal orientation is different from (100). Each of the secondary monocrystalline silicon seeds 124 has a second crystal orientation vertical to a top surface of the secondary monocrystalline silicon seeds 124, wherein the second crystal orientation is different from the first crystal orientation. An angle θ1 between the first and second crystal orientations is not less than about 35 degrees. Each of the primary monocrystalline silicon seeds 122 is adjacent to at least one of the secondary monocrystalline silicon seeds 124, and separate from the others of the primary monocrystalline silicon seeds 122.

The selection and arrangement of the primary and secondary monocrystalline silicon seeds 122 and 124 are described as above.

In order to prove the whole crystalline silicon ingot formed by the method of the present invention to have an improved quality and to prove subsequently formed solar cells to have improved photo-electron conversion efficiencies, the lifetimes of the crystalline silicon ingot of the present invention and a compared one are measured and the subsequently photo-electron conversion efficiencies are gauged. The crystalline silicon ingot of the present invention, seeded using the crystalline silicon seed layer 12 shown in FIG. 2, has a height of about 250 mm. The compared crystalline silicon ingot, seeded using monocrystalline silicon seeds having a crystal orientation of (100) and using a directional solidification process, has a height of about 250 mm.

Table 1 lists a result of measuring the lifetimes of the bottoms, middles and tops of the crystalline silicon ingot of the present invention and the compared one using a microwave photoconductive decay (μ-PCD).

TABLE 1

| Lifetime (μs) | Crystalline silicon ingot of present invention | Compared crystalline silicon ingot |
|---|---|---|
| Bottom | 6.65 | 6.72 |
| Middle | 8.10 | 7.70 |
| Top | 6.24 | 5.52 |

The principle of μ-PCD is to measure variation of signals using photon excitation, photoconductivity decay and a microwave system. Internal electron-hole pairs can be excited by applying an infrared pulsed light source to a semiconductor material. The light source has a wavelength of 904 nm, and thus has a penetration level close to a surface of the material, wherein the light source has a penetration depth of about 30 μm. After the semiconductor material is excited, electron-hole pairs therein are joined again, and thus a photoconductivity ($\sigma$) is decayed with time, wherein the decay of the photoconductivity can be gauged using the microwave system. In general, the decay of the photoconductivity can be represented by a fixed exponential function. By comparing the function and fixed time constants, lifetime values at related positions of a sample can be obtained. In principle, the lifetime values relate to impurity concentration. A long lifetime responds to impurities with a low concentration.

Referring to Table 1, the lifetime of the bottom, middle and top of the crystalline silicon ingot of the present invention is longer than that of the bottom, middle and top of the compared one. Accordingly, the crystalline silicon ingot of the present invention has a lower impurity concentration than the compared one, that is, the whole crystalline silicon ingot of the present invention has a better quality than the compared one.

Figure 4:
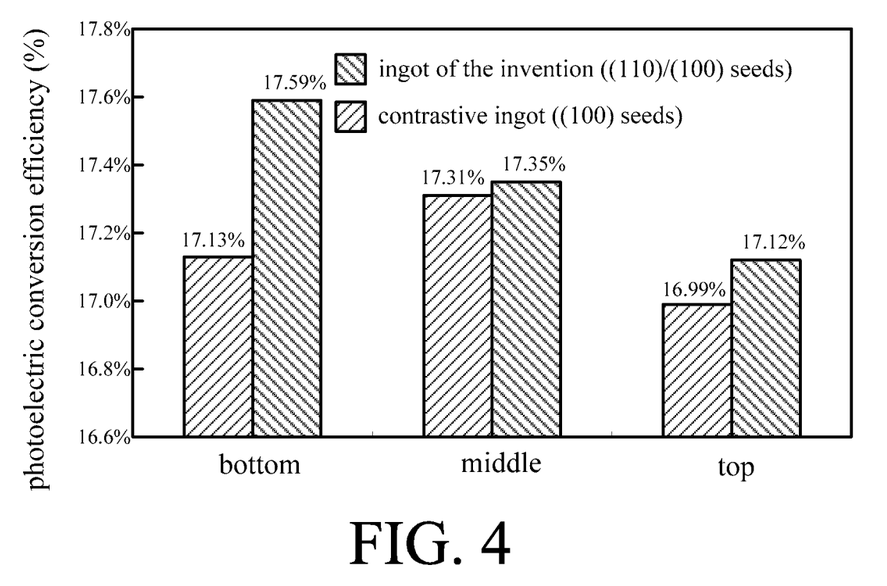
FIG. 4 illustrates a result of comparing average photoelectron conversion efficiencies of solar cells created from a crystalline silicon ingot of an embodiment of the present invention and those created from a compared crystalline silicon ingot.

FIG. 4 illustrates photo-electron conversion efficiencies of solar cells created from the bottom, middle and top of the crystalline silicon ingot of the present invention and created from the bottom, middle and top of the compared one. Referring to FIG. 4, the whole crystalline silicon ingot of the present invention has an improved quality, and the subsequently formed solar cells have relatively high photo-electron conversion efficiencies. In contrast, the whole compared crystalline silicon ingot has a poor quality, and the subsequently formed solar cells have relatively low photo-electron conversion efficiencies. In summary, in accordance with the present invention, the method is provided to form the crystalline silicon ingot using the crystalline silicon seed layer different from the prior art and using the directional solidification process. The crystalline silicon ingot of the present invention has an improved quality, and the subsequently formed solar cells have relatively high photo-electron conversion efficiencies.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain. Furthermore, unless stated otherwise, the numerical ranges provided are intended to be inclusive of the stated lower and upper values. Moreover, unless stated otherwise, all material selections and numerical values are representative of preferred embodiments and other ranges and/or materials may be used.

The scope of protection is limited solely by the claims, and such scope is intended and should be interpreted to be as broad as is consistent with the ordinary meaning of the language that is used in the claims when interpreted in light of this specification and the prosecution history that follows, and to encompass all structural and functional equivalents thereof.

What is claimed is:

1. A method for fabricating a crystalline silicon ingot, comprising:
providing a crystalline silicon seed layer in a mold, wherein said crystalline silicon seed layer comprises multiple primary monocrystalline silicon seeds and multiple secondary monocrystalline silicon seeds, each primary monocrystalline silicon seeds has a first crystal orientation different from (100), each of said secondary monocrystalline silicon seeds has a second crystal orientation different from said first crystal orientation, an angle between said first and second crystal orientations is not less than about 35 degrees, each primary monocrystalline silicon seeds is adjacent to at least one secondary monocrystalline silicon seeds, and separate from other primary monocrystalline silicon seeds;
filling a silicon melt into said mold such that said silicon melt contacts said crystalline silicon seed layer; and
cooling said mold using a directional solidification process such that said silicon melt is solidified and said crystalline silicon ingot is formed comprising said crystalline silicon seed layer,
wherein said first crystal orientation is (110), said second crystal orientation is (100), multiple secondary monocrystalline silicon seeds are alternately arranged between multiple primary monocrystalline silicon seeds, and volume ratio of said primary monocrystalline silicon seeds to said crystalline silicon seed layer is greater than about 80%.

2. The method of claim 1, wherein multiple primary monocrystalline silicon seeds and multiple secondary monocrystalline silicon seeds are alternately arranged in said mold.

3. The method of claim 1, wherein one secondary monocrystalline silicon seeds disposed between two primary monocrystalline silicon seeds has a width value between 3 and 5 centimeters.

4. A crystalline silicon ingot comprising a crystalline silicon seed layer at a bottom of said crystalline silicon ingot, wherein said crystalline silicon seed layer comprises multiple primary monocrystalline silicon seeds and multiple secondary monocrystalline silicon seeds, each primary monocrystalline silicon seeds has a first crystal orientation different from (100), each of said secondary monocrystalline silicon seeds has a second crystal orientation different from said first crystal orientation, an angle between said first and second crystal orientations is not less than about 35 degrees, each primary monocrystalline silicon seeds is adjacent to at least one secondary monocrystalline silicon seeds, and separate from other primary monocrystalline silicon seeds,
   wherein said first crystal orientation is (110), and said second crystal orientation is (100), and volume ratio of said primary monocrystalline silicon seeds to said crystalline silicon seed layer is greater than about 80%.

5. The crystalline silicon ingot of claim 4, wherein multiple primary monocrystalline silicon seeds and multiple secondary monocrystalline silicon seeds are alternately arranged.

6. The crystalline silicon ingot of claim 4, wherein multiple secondary monocrystalline silicon seeds are alternately arranged between multiple primary monocrystalline silicon seeds.

7. A method for fabricating a crystalline silicon ingot, comprising:
   providing a crystalline silicon seed layer in a mold, wherein said crystalline silicon seed layer comprises multiple primary monocrystalline silicon seeds and multiple secondary monocrystalline silicon seeds, wherein each primary monocrystalline silicon seed has a first top surface and a first side surface and has a first crystal orientation vertical to said first top surface and a second crystal orientation vertical to said first side surface, each secondary monocrystalline silicon seed has a second top surface and a second side surface and has said first crystal orientation vertical to said second top surface and a third crystal orientation vertical to said second side surface, said first crystal orientation is different from (100), said third crystal orientation is different from said second crystal orientation, wherein an angle between said third and second crystal orientations is not less than about 35 degrees, each primary monocrystalline silicon seed is adjacent to at least one secondary monocrystalline silicon seeds, and separate from other primary monocrystalline silicon seeds;
filling a silicon melt into said mold such that said silicon melt contacts said crystalline silicon seed layer; and
cooling said mold using a directional solidification process such that said silicon melt is solidified and said crystalline silicon ingot is formed comprising said crystalline silicon seed layer,
   wherein said first crystal orientation is (110), and said second crystal orientation is (100), and volume ratio of said primary monocrystalline silicon seeds to said crystalline silicon seed layer is greater than about 80%.

8. The method of claim 7, wherein multiple primary monocrystalline silicon seeds and multiple secondary monocrystalline silicon seeds are alternately arranged in said mold.

9. The method of claim 7, wherein multiple secondary monocrystalline silicon seeds are alternately arranged between multiple primary monocrystalline silicon seeds.

* * * * *